United States Patent
Gardner et al.

[11] Patent Number: 6,037,244
[45] Date of Patent: Mar. 14, 2000

[54] METHOD OF MANUFACTURING A SEMICONDUCTOR DEVICE USING ADVANCED CONTACT FORMATION

[75] Inventors: Mark I. Gardner, Cedar Creek; Thomas E. Spikes, Jr., Round Rock; Robert Paiz, Austin; Frederick N. Hause, Austin; Sey-Ping Sun, Austin, all of Tex.

[73] Assignee: Advanced MicroDevices, Inc., Sunnyvale, Calif.

[21] Appl. No.: 08/821,660

[22] Filed: Mar. 19, 1997

[51] Int. Cl.[7] .............................. H01L 21/28; H01L 21/31
[52] U.S. Cl. ..................... 438/586; 438/618; 438/620; 438/622; 438/631; 438/637
[58] Field of Search ..................... 438/597, 586, 438/618, 620, 622, 623, 631, 637

[56] References Cited

U.S. PATENT DOCUMENTS

| | | | |
|---|---|---|---|
| 4,541,169 | 9/1985 | Bartush | 438/620 |
| 5,158,910 | 10/1992 | Cooper et al. | 438/631 |
| 5,275,973 | 1/1994 | Gelatos | 438/623 |
| 5,283,208 | 2/1994 | Lorsung et al. | 438/623 |
| 5,710,061 | 1/1998 | Cleeves | 438/618 |

OTHER PUBLICATIONS

Wolf, Stanley, "Silicon Processing for the VLSI Era", vol. 2: Process Integration, 1990, Lattice Press, pp. 102–111.

*Primary Examiner*—T. N. Quach

[57] ABSTRACT

A method of forming a semiconductor device by using a pillar to form a contact with an active region of the device. A semiconductor device is formed by forming one or more active regions on a substrate of the semiconductor device and forming a pillar over at least a portion of one of the active regions. An insulating film selective to the pillar is provided over portions of the substrate adjacent the pillar. The pillar is then used to form a conductive contact with the active region over which it is formed. In one embodiment, the pillar is formed from a photoresist, while in other embodiments, the pillar is formed from a conductor material such as a metal. The active region may form a source/drain region or a gate electrode.

31 Claims, 4 Drawing Sheets

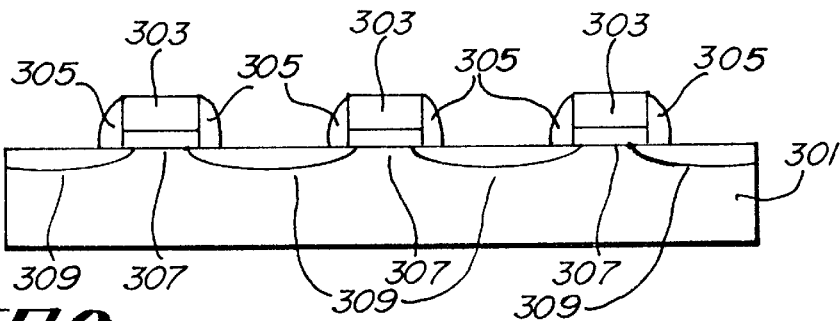
_Fig. 3A._
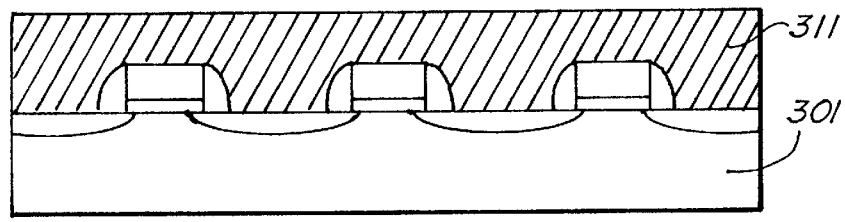
_Fig. 3B._
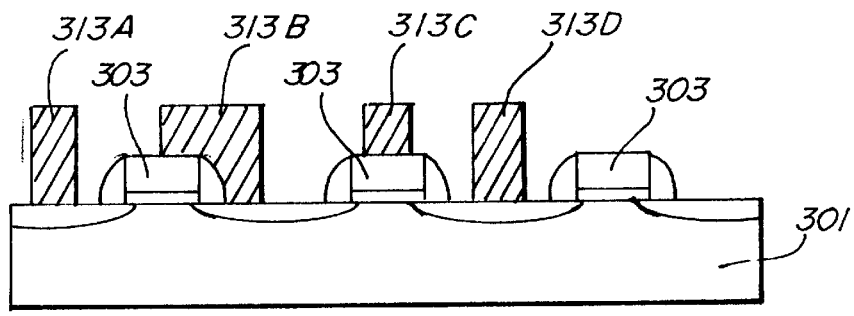
_Fig. 3C._
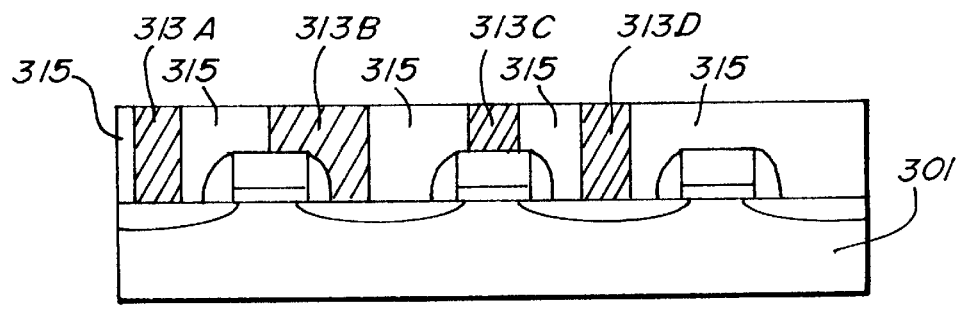
_Fig. 3D._

METHOD OF MANUFACTURING A SEMICONDUCTOR DEVICE USING ADVANCED CONTACT FORMATION

FIELD OF THE INVENTION

The present invention is directed generally to a method of manufacturing a semiconductor device and, more particularly, to a method of forming contacts on a semiconductor device using pillars.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to a region used for the formation of a source or drain.

After the source/drain regions have been formed, a relatively thick oxide layer (not shown), often referred to as a contact formation layer, is disposed over the substrate 101. Contact openings are generally cut into the thick oxide layer to expose the source/drain regions 105 and the surface of the gate electrode 103. The contact openings are then filled with a metal, such as tungsten or aluminum, which is used as a terminal to connect active regions on the chip.

Contact openings are typically formed using photolithography. Generally, a photoresist material is deposited over the contact formation layer, patterned, and removed to expose portions of the contact formation layer. The exposed portions of the contact formation layer are then etched to the surface of the active region (e.g., a gate electrode or source/drain region) to form the contact opening. A more detailed description of contact formation and the fabrication thereof may be found in S. Wolf, *Silicon Processing for the VLSI Era*, Vol. 2: Processing Integration, pp. 102–111.

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

New semiconductor fabrication processes and devices are continually needed to advance the trend of reduced semiconductor device size and increased performance. For example, the size of contact openings is one important dimension which must be scaled down as the device structure is made smaller. The minimum size of conventionally-formed contact openings is dependent upon the minimum-resolution of the patterning and etching technology used to open the contact openings. The resolution of conventional patterning and etching technology thus limits further scaling of device dimensions.

SUMMARY OF THE INVENTION

Generally, the present invention relates to a method of forming a semiconductor device by using a pillar to form a contact with an active region of the device.

In accordance with one embodiment of the invention, a semiconductor device is formed by forming one or more active regions on a substrate of the semiconductor device and forming a pillar over at least a portion of one of the active regions. An insulating film selective to the pillar is provided over portions of the substrate adjacent the pillar. The pillar is then used to form a conductive contact with the active region over which it is formed. The pillar may be formed from a number of different materials, including photoresist and conductive materials such as a metal. The active region may form a source/drain region or a gate electrode. In one embodiment, the pillar is used to form the contact by selectively removing the pillar to open a region in the insulating film and then filling the open region with a conductive material such as a metal.

In accordance with another embodiment of the invention, a semiconductor device is formed by forming a plurality of active regions on a substrate of a semiconductor device and forming a first pillar over at least a portion of one of the active regions and a second pillar over at least a portion of another one of the active regions. An insulating film is then provided over portions of the substrate adjacent to the first and second pillars. The first and second pillars are then used to form first and second conductive contacts with the active regions over which the pillars are formed. The pillars may be formed of a conductive material and may be selectively removed to form the conductive contacts. For example, one of the pillars may be removed and filled with a conductive material to form a contact with the active region over which is disposed, while the other pillar may be left on the substrate to form a contact with the active region over which it is disposed. The active regions in this embodiment may also be source/drain regions or gate electrodes.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIGS. 3A–3H illustrate another fabrication process in accordance with another embodiment of the invention.

Figure 1:
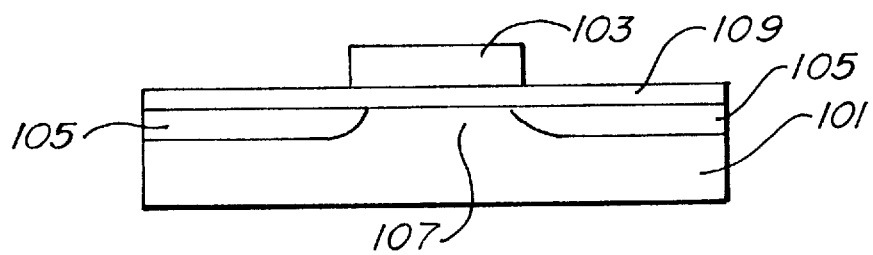
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS and CMOS structures. While the present invention is not so limited, an appreciation of various aspects of the invention will be gained through a discussion of the fabrication process and characteristics of such a device in connection with the examples provided below.

The present invention generally provides a pillar in a medium selective to the pillar. The pillar is disposed over one or more active regions of the device and is used to form a contact with the active region(s) over which it is disposed. As used herein, the term active region encompasses regions of a device which are or will be used as active portions of the device ultimately formed such as source/drain regions or gate electrodes.

Figure 2E:
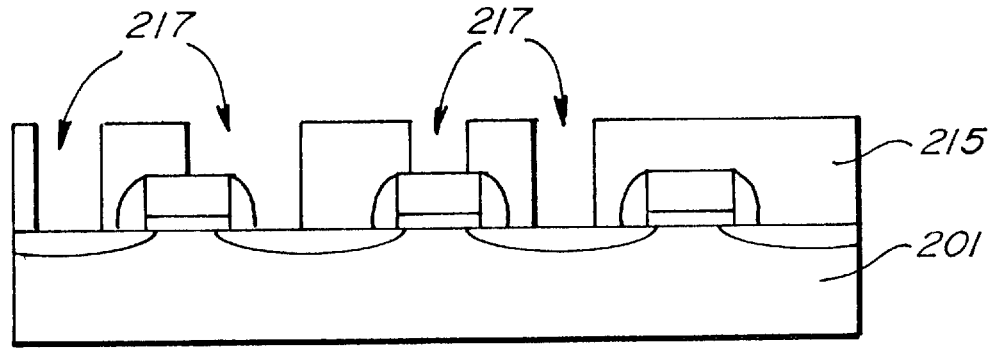
FIGS. 2A–2F illustrate a fabrication process in accordance with one embodiment of the invention.
Figure 2F:
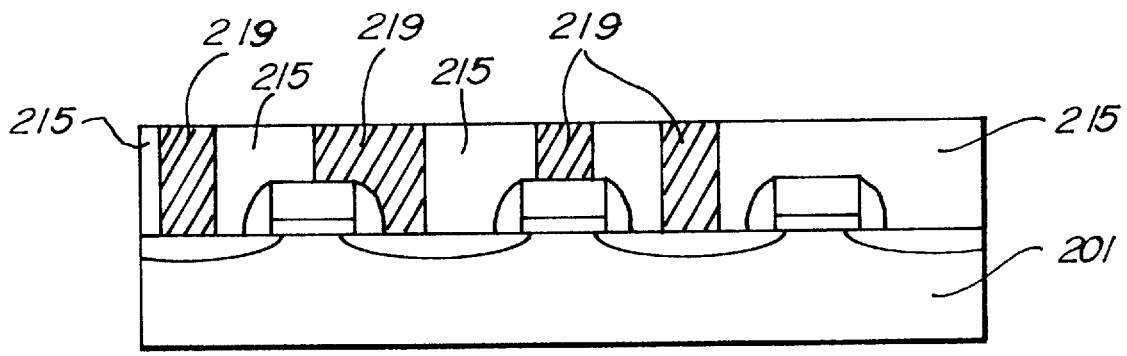
Figure 2A:
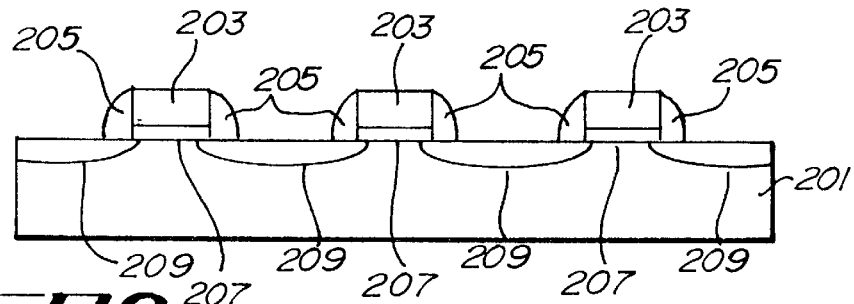
Figure 2B:
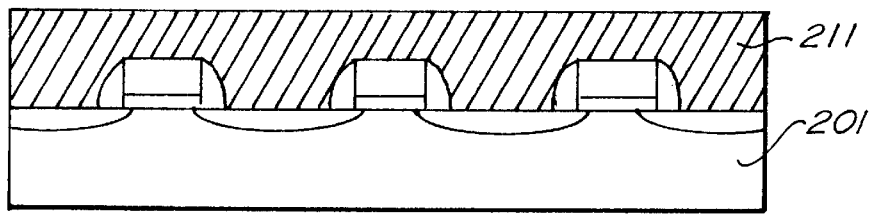

FIGS. 2A–2F illustrate a process for fabricating a semiconductor device using one or more pillars to form a contact with one or more active regions of the device. Using known techniques, gate electrodes 203 and source/drain regions 209 are formed on a substrate 201. The gate electrodes 203 are typically insulated from the substrate by a thin gate oxide layer 207 and typically include spacers 205 formed on their sidewalls. A silicide layer (not shown) is typically formed over the source/drain regions 209 and gate electrodes 203 to facilitate contact formation. The resultant structure is illustrated in FIG. 2A. It will be appreciated that a number of different known fabrication techniques could be used to obtain the structure depicted in FIG. 2A. The source/drain regions 209 may be lightly-doped drain (LDD) source/drain regions, for example.

A layer 211 of pillar material is formed over the substrate 201 and the gate electrodes 203. In one particular embodiment, the pillar material is a photoresist material. However, the invention is not so limited. Other types of pillar materials, such as metals, may also be used. The layer of photoresist material may be provided using well-known deposition and spinning techniques to form the relatively planar structure illustrated in FIG. 2B.

Figure 2C:
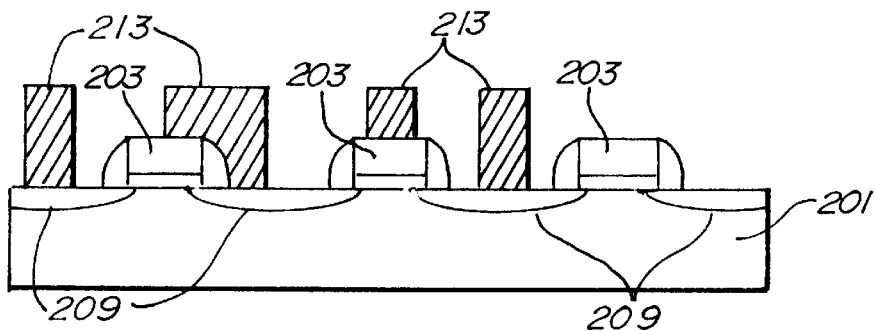
Figure 2D:
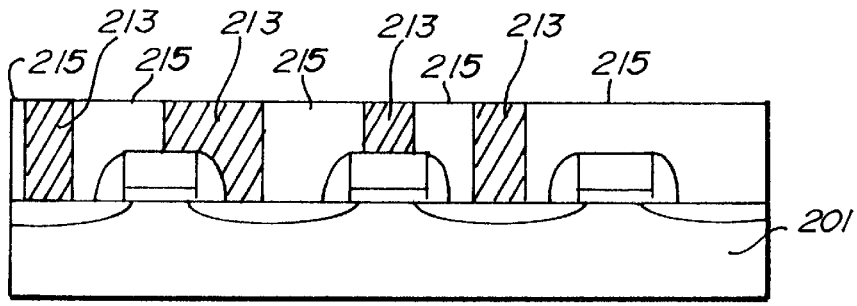

Portions of the photoresist layer 211 are removed to form photoresist pillars 213 over active regions of the device. The resultant structure is illustrated in FIG. 2C. The photoresist layer 211 is removed by patterning and developing the photoresist, for example, using well-known techniques.

After the photoresist pillars 213 have been formed, areas of the substrate 201 not covered by the pillars 213 are provided with an insulating film 215 selective to the pillar material. The insulating film 215 may be formed from a number of different materials depending upon the particular type of pillar material. Where the pillar material is a photoresist, the insulating film 215 may, for example, be formed of an oxide, such as $SiO_2$, or a nitride, such as $SiN_2$, which are selective to the photoresist material. The particular processing steps for providing the insulating film 215 are selected such that the processing temperatures do not exceed the melting temperature of the pillar material. Processing temperatures less than 250° C. would suffice for many applications using a photoresist pillar material.

In one embodiment, the insulating film 215 is an oxide, such as $SiO_2$. The oxide may be deposited using a number of techniques, such as an LPCVD plasma deposit spin-on-glass (SOG) technique, and polished to form the structure of FIG. 2D. In alternate embodiments, the oxide may be provided using a combination of deposition and SOG techniques.

The photoresist pillars 213 are removed to form contact openings 217 to the active regions thereunder. The resultant structure is illustrated in FIG. 2E. The photoresist pillars 213 may be removed, for example, by applying a developer solution to the substrate. The developer solution, selectively removes the photoresist pillars 213, leaving the insulating film 215 intact and forming the contact openings 217 in the insulating film 215.

The contact openings 217 are filled with a conductive material to form contacts 219 with the active regions. The contacts 219 may form contacts with a single active region or may interconnect two active regions, such as a gate electrode and a source/drain region, as desired. The conductive material may be, for example, a metal such as tungsten, aluminum, titanium or cobalt. In one exemplary embodiment, the contacts 219 are formed by depositing and planarizing a metal using well-known techniques. The resultant structure is illustrated in FIG. 2F. Fabrication of the device may continue with conventional fabrication steps to form a complete device structure.

Using the above process, a photoresist pillar is used to form contact openings to active regions of a semiconductor device. The pillars are formed from a sacrificial material such as a photoresist and are subsequently removed by stripping the sacrificial pillars. When using a photoresist pillar, the minimum size of the contact openings 217 is primarily dependent upon the resolution of the photolithography pattern used to form the photoresist pillars. Unlike conventional contact openings, formation of the contact openings 219 using the above process is not dependent upon the resolution of an oxide etching technique. Accordingly, in one particular embodiment of the invention, more precisely sized contact openings can be formed as compared to conventional techniques. Moreover, decreased size of the openings can be achieved.

The above process also enhances device performance. In conventional techniques, where contact openings are formed by etching an oxide, a nitrate is often disposed on the substrate surface to avoid etching into the silicon substrate. In some instances, the nitrate is not completely removed prior to contact formation, thus resulting in poor device performance. In the above process, active regions of the substrate are not subjected to possible damage by etching thus permitting enhanced device performance.

In an alternate embodiment, the pillars are formed of a conductive material, for example, a metal such as tungsten or aluminum rather than a photoresist. The conductive pillars may be provided by depositing and polishing a metal layer to form a relatively planar structure. This may be done using well-known metal deposition and polishing techniques. The conductive pillars are then formed, for example, by selectively masking the metal layer and etching the unmasked portions of the metal layer, using well-known masking and etching techniques. An insulating film, such as $SiN_2$ or $SiO_2$, is provided between the conductive pillars, polished and planarized with the upper surface of the pillars. To form contacts with the active regions, the conductive pillars may be removed as sacrificial pillars and be filled with another metal or may be left in place to form the contact itself. In one embodiment, the conductive pillars are formed of aluminum and are removed by a Caros stripping technique using $H_2SO_4$ and $H_2O_2$.

Using the above process, contact and interconnect formation can be facilitated. In addition, the above process, by using a conductive material rather than a photoresist for the pillars, allows for variability in processing steps between pillar formation and contact formation. For example, the intermediate processing steps may include photolithography steps or relatively high temperature steps which could affect the pillars if formed from photoresist. In many applications, for example, intermediate processing steps at temperatures up to 400–800° C. may be performed without significantly affecting use of the conductive pillars for contact formation.

While the above-described embodiments illustrate the formation of pillars on doped gate electrodes and source/drain regions, the invention is not so limited. In other embodiments, pillars may be formed prior to doping the gate electrodes and/or the active regions used to form source/drain regions 209. For example, active regions of the substrate 201 and/or the gate electrodes 203 may be implanted with a dopant through the contact openings 219 after removing the pillars to form source/drain regions and activate the gate electrodes.

Figure 3E:
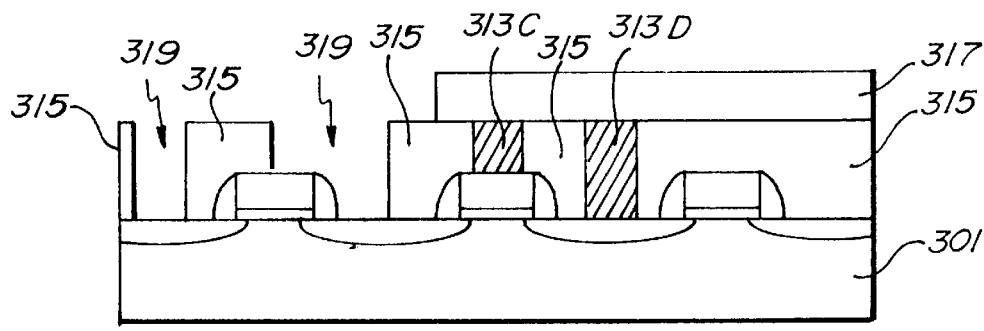

FIGS. 3A–3H illustrate a fabrication process for forming contacts to and local interconnects between active regions of a semiconductor device. Using known techniques, gate electrodes 303 and source/drain regions 309 are formed on a substrate 301. The gate electrodes 303 are typically insulated from the substrate by a thin gate oxide layer 307 and typically include spacers 305 formed on their sidewalls. A silicide layer (not shown) is typically formed over the source/drain regions 309 and gate electrodes 303 to facilitate contact formation. The resultant structure is illustrated in FIG. 3A. It will be appreciated that a number of different known fabrication techniques could be used to obtain the structure depicted as FIG. 3A.

A layer 311 of conductive pillar material is formed over the substrate 301 and the gate electrodes 303 and is typically planarized to form the structure illustrated in FIG. 3B. In the exemplary embodiment, the conductive pillar material is a metal such as tungsten or aluminum. However, the invention is not so limited. Other types of pillar material may also be used. The metal pillar layer 311 may be provided using well-known techniques, such as sputter or physical vapor deposition.

Portions of the metal pillar layer 311 are removed to form metal pillars 313A–313D over active regions of the device, as illustrated in FIG. 3C. The metal pillar layer 311 can be removed, for example, by selectively masking the metal pillar layer 311 and etching unmasked portions of the metal pillar layer 311, using well-known masking and etching techniques.

After the metal pillars 313A–313D have been formed, areas of the substrate not covered by the metal pillars 313A–313D are provided with an insulating film 315 selective to the pillar material. The insulating film 315 and metal pillar 313 are then planarized to form the structure illustrated in FIG. 3D. The insulating film 315 may be formed from a number of different materials depending upon the particular type of pillar material used. The processing steps for providing the insulating film 315 are selected such that the processing temperatures do not exceed the melting temperature of the conductive pillar material. Processing temperatures less than 400–800° C. would suffice for many applications using a conductive pillar material.

The insulating film 315 may be formed, for example, of an oxide or nitride, such as $SiO_2$ or $SiN_2$. Using well-known equipment and techniques, the oxide may be deposited, for example, by a spin-on-glass (SOG) technique, and polished to form the structure of FIG. 3D. In some embodiments, the oxide may be provided using a combination of deposition and SOG techniques.

The metal pillars 313A–313B are selectively removed to form contact openings 319 in the insulating film 315, as illustrated in FIG. 3E. In particular, the metal pillars 313A–313B are selectively removed by selectively forming an insulating layer 317, such as silicon dioxide, over the substrate 301 and removing the insulating layer 317 to expose only those metal pillars 313A–313B desired to be removed. The insulating layer 317 may be selectively formed using conventional photolithographic techniques.

The process used to remove unmasked pillars 313A–313B and form the contact openings 319, may vary with the type of conductive material used to form the metal pillars. For example, metal pillars formed of Aluminum may be removed using a Caros stripping technique as noted above. It should be appreciated that the insulating layer 317 may also be used to expose other areas on the substrate 301 where access to metal pillars through the insulating layer 317 is desired.

Figure 3F:
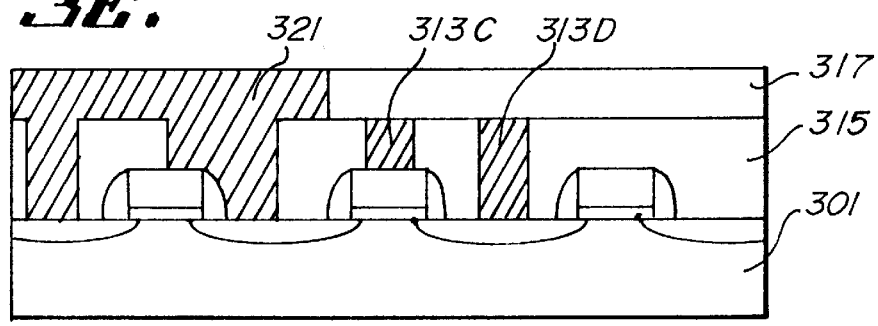

The contact openings 317 are filled with a conductive material such as tungsten or aluminum to form contacts 321 with the active regions, as illustrated in FIG. 3F. The contacts 321 may, for example, form local interconnects with other devices on the substrate, as illustrated in FIG. 3F.

Figure 3G:
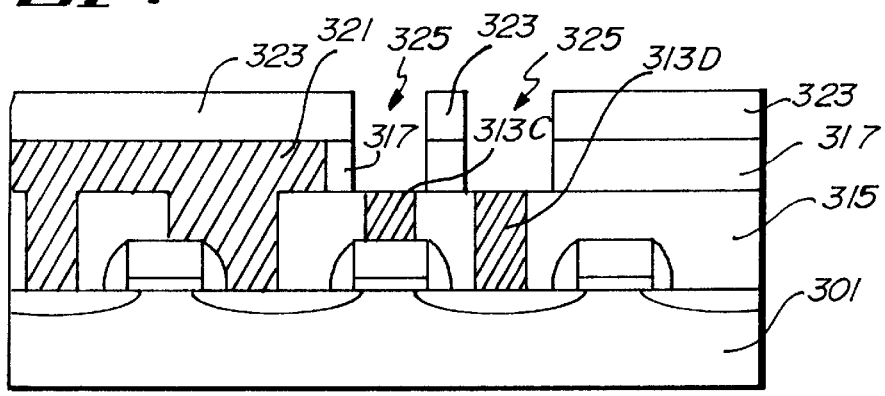

The structure may be planarized and another insulating layer 323, such as silicon dioxide, may be formed over the substrate 301 to continue interconnect formation. In the exemplary embodiment, contact openings 325 are cut through the insulating layer 323 and the insulating layer 317 to expose pillars 313C and 313D. The resultant structure is illustrated in FIG. 3G. The contact openings 325 may be formed by selectively masking the insulating layer 323 and etching the unmasked regions of the insulating layers, using conventional photolithographic and etching techniques.

Figure 3H:
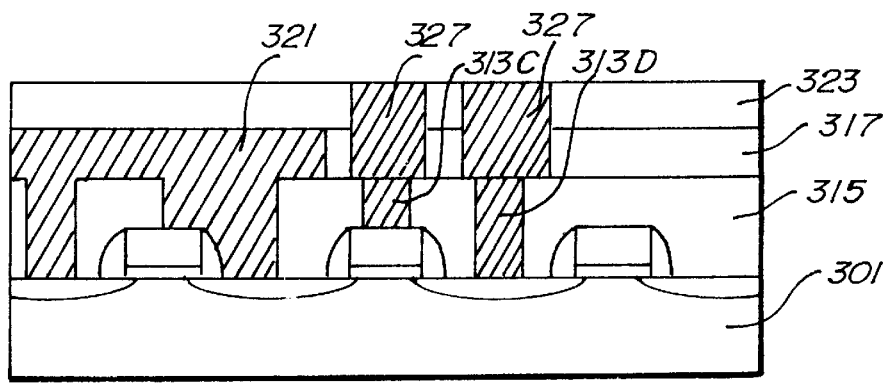

The contact openings 325 are filled with a conductive material 327, typically a metal such as tungsten or aluminum, to form contacts with the exposed pillars 313C and 313D. In this manner, the original metal pillars 313C and 313D are used to form contacts with a gate electrode and source/drain region respectively. The metal pillars 313C–313D and conductive material 327 may jointly form stacked vias. The resultant structure is illustrated in FIG. 3H. Fabrication of the device may continue with conventional fabrication steps to form a complete device structure.

Using the above process, conductive pillars may be formed and selectively removed to facilitate the formation of contacts to and local interconnects between active regions of a semiconductor device. Conductive pillars may be used as sacrificial plugs which are later removed and filled with a metal to form contacts to and/or local interconnects between active regions as desired. Other conductive pillars may be left in to form contacts themselves. Advantageously, the above process facilitates contact and local interconnect formation and allows for higher temperature intermediate steps, as noted above.

The present invention is applicable to the fabrication of a number of different devices where pillars are used to form contact openings to active regions of a semiconductor device. Accordingly, the present invention should not be considered limited to the particular examples described above, but rather should be understood to cover all aspects of the invention as fairly set out in the attached claims.

Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a semiconductor device, comprising:

forming a plurality of active regions in a substrate of a semiconductor device;

forming a first pillar over at least a portion of a first one of the active regions and a second pillar over at least a portion of a second one of the active regions;

providing an insulating film over portions of the substrate adjacent the first and second pillars;

selectively removing the first pillar to expose the portion of the first one of the active regions while leaving the second pillar, the removal of the first pillar leaving an open region in the insulating film above the portion of the first one of the active regions; and filling the open region with a first conductive material to form a first conductive contact with the first one of the active regions.

2. The process of claim 1, wherein the forming the first and second pillars includes providing a layer of pillar material over the substrate and selectively removing the pillar material.

3. The process of claim 1, wherein the providing an insulating film includes depositing an oxide.

4. The process of claim 1, wherein the providing an insulating film includes growing an oxide.

5. The process of claim 1, wherein the providing an insulating film includes planarizing an upper surface of the insulating film and an upper surface of the first pillar and an upper surface of the second pillar.

6. The process of claim 1, wherein the first and second pillars are made of a conductive material.

7. The process of claim 1, further including:

forming an insulating layer over the substrate after filling the open region with the conductive material;

selectively removing portions of the insulating layer to expose the second pillar; and filling the removed portions of the insulating layer with a second conductive material.

8. The process of claim 7, wherein the second conductive material and second pillar form a stacked via.

9. The process of claim 1, wherein at least one of the first and second active regions is a source/drain region.

10. The process of claim 1, wherein at least one of the first and second active regions is a gate electrode.

11. The process of claim 1, further comprising selectively removing the second pillar, prior to forming the insulating layer over the second pillar, to open a region in the insulating film and expose the portion of the second one of the active regions; and filling the open region with a conductive material to form a second conductive contact with the second active region.

12. The process of claim 11, wherein the first and second pillars are made of a metal.

13. The process of claim 11, wherein first and second pillars are made of a photoresist.

14. A process of forming a semiconductor device, comprising:

forming a plurality of active regions in a substrate of a semiconductor device;

forming a first pillar over at least a portion of a first one of the active regions and a second pillar over at least a portion of a second one of the active regions;

providing an insulating film over portions of the substrate adjacent the first and second pillars;

forming an insulating layer over the insulating film and first and second pillars; and selectively removing a portion of the insulating layer to expose the first and second pillars;

selectively removing the first and second pillars to open first and second regions in the insulating film and expose the portions of the first and second active regions; and filling the first and second open regions and at least a portion of the removed portion of the insulating layer with a first conductive material to form conductive contacts to and an interconnect between the first and second active regions.

15. The process of claim 14, wherein the forming the first and second pillars includes providing a layer of pillar material over the substrate and selectively removing the pillar material.

16. The process of claim 14, wherein the providing an insulating film includes depositing an oxide.

17. The process of claim 14, wherein the providing an insulating film includes growing an oxide.

18. The process of claim 14, wherein the providing an insulating film includes planarizing an upper surface of the insulating film and an upper surface of the pillar.

19. The process of claim 14, further comprising selectively removing the second pillar, prior to forming the insulating layer over the second pillar, to open a region in the insulating film and expose the portion of the second one of the active regions; and filling the open region with a conductive material to form a second conductive contact with the second active region.

20. The process of claim 19, wherein the first and second pillars are made of a metal.

21. The process of claim 19, wherein the first and second pillars are made of a photoresist.

22. The process of claim 14, wherein at least one of the first and second active regions is a source/drain region.

23. The process of claim 14, wherein at least one of the first and second active regions is a gate electrode.

24. The process of claim 14, wherein at least one of the first and second pillars overlaps a portion of two active regions.

25. A process of forming a semiconductor device, comprising:

forming a plurality of active regions in a substrate of a semiconductor device;

forming a first pillar over at least a portion of a first one of the active regions, a second pillar over at least a portion of a second one of the active regions, and a third pillar over at least a portion of a third active region;

providing an insulating film over portions of the substrate adjacent the first, second, and third pillars;

forming an insulating layer over the insulating film and first, second, and third pillars; and selectively removing a portion of the insulating layer to expose the first and second pillars;

selectively removing the first and second pillars to open first and second regions in the insulating film and expose the portions of the first and second active regions; and filling the first and second open region and at least a portion of the removed portion of the insulating layer with a conductive material to form conductive contacts to and an interconnect between the first and second active regions.

26. The process of claim 25, further including:

forming a second insulating layer over the substrate after filling the first and second open regions with the conductive material;

selectively removing a portion of the second insulating film to expose the third pillar; and filling the removed portion of the second insulating layer with a second conductive material to contact the third pillar.

27. The process of claim 25, further comprising selectively removing the third pillar, prior to forming the insulating layer over the third pillar, to open a region in the insulating film and expose the portion of the third one of the active regions; and filling the open region with a conductive material to form a third conductive contact with the third active region.

28. The process of claim 27, wherein the first, second, and third pillars are made of a metal.

29. The process of claim 27, wherein the first, second, and third pillars are made of a photoresist.

30. The process of claim 25, further including:

forming an insulating layer over the substrate after filling the open region with the conductive material;

selectively removing portions of the insulating layer to expose the third pillar; and filling the removed portions of the insulating layer with a second conductive material.

31. The process of claim 30, wherein the second conductive material and third pillar form a stacked via.

* * * * *